(12) United States Patent
Gomm

(10) Patent No.: US 7,701,788 B2
(45) Date of Patent: Apr. 20, 2010

(54) APPARATUS AND METHOD FOR SELECTIVELY CONFIGURING A MEMORY DEVICE USING A BI-STABLE RELAY

(75) Inventor: Tyler J. Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 738 days.

(21) Appl. No.: 11/373,083

(22) Filed: Mar. 9, 2006

(65) Prior Publication Data

US 2006/0155884 A1 Jul. 13, 2006

Related U.S. Application Data

(62) Division of application No. 10/666,454, filed on Sep. 17, 2003, now Pat. No. 7,177,170.

(51) Int. Cl.
*G11C 7/00* (2006.01)
(52) U.S. Cl. .................... 365/201; 324/185.1
(58) Field of Classification Search .......... 365/201; 324/158.1
See application file for complete search history.

(56) References Cited

U.S. PATENT DOCUMENTS

| | | | | |
|---|---|---|---|---|
| 3,355,725 | A | 11/1967 | McKeon | 340/174 |
| 5,084,838 | A | 1/1992 | Kajimoto et al. | 365/63 |
| 5,216,637 | A | 6/1993 | Vaillancourt | 365/230.03 |
| 5,217,917 | A * | 6/1993 | Takahashi et al. | 365/72 |
| 5,506,499 | A * | 4/1996 | Puar | 324/158.1 |
| 6,341,090 | B1 * | 1/2002 | Hiraki et al. | 365/200 |
| 6,473,361 | B1 | 10/2002 | Chen et al. | 365/244 |
| 6,535,780 | B1 | 3/2003 | Anderson et al. | 700/121 |
| 6,667,873 | B2 | 12/2003 | Lyke et al. | 361/160 |
| 2002/0135409 | A1 | 9/2002 | Gomm et al. | 327/161 |
| 2003/0042951 | A1 | 3/2003 | Gomm | 327/158 |
| 2004/0024959 | A1 | 2/2004 | Taylor | 711/105 |

OTHER PUBLICATIONS

Gomm, Troy et al., "In-Plane Linear Displacement Bistable Microrelay," *Journal of Micromechanics and Microengineering*, vol. 12, 2002, pp. 1-8.
Kim, Joonwon et al., "*Mercury Contact Micromechanical Relays*," Mechanical and Aerospace Engineering Department, University of California, Los Angeles.

* cited by examiner

*Primary Examiner*—Son Dinh
(74) *Attorney, Agent, or Firm*—Dorsey & Whitney LLP

(57) ABSTRACT

The disclosed embodiments of the present invention include a semiconductor memory apparatus having a selectable memory capacity. In one embodiment, a system includes input, output, and data storage devices, a processor coupled to the devices, a memory device coupled to the processor, and a configuration circuit interposed between the processor and the memory device to selectively couple lines in the address, control and data busses of the processor to lines in the address, control and data busses of the memory device. In another embodiment, a memory device includes an array coupleable to one or more busses of an external device and a configuration circuit between the array and the busses of the external device to selectively couple the busses to the memory cell array. In a particular embodiment, the configuration circuit includes one or more bi-stable relays, such as Micro-Electrical-Mechanical System (MEMS) relays.

23 Claims, 3 Drawing Sheets

APPARATUS AND METHOD FOR SELECTIVELY CONFIGURING A MEMORY DEVICE USING A BI-STABLE RELAY

CROSS-REFERENCE TO RELATED APPLICATION

This application is a divisional of U.S. patent application Ser. No. 10/666,454, filed Sep. 17, 2003, issued as U.S. Pat. No. 7,177,170.

TECHNICAL FIELD

The present invention is generally directed to semiconductor memory devices, and in particular to memory devices that may be selectively reconfigured.

BACKGROUND OF THE INVENTION

Semiconductor memory devices constitute an essential part of computer systems due to the relatively high access speeds obtainable and the generally low cost of such devices. One type of semiconductor memory device that is particularly advantageous is the dynamic random access memory device (DRAM), which utilizes a single transistor and capacitor per memory cell in a memory array structure. The simplicity of this design permits the fabrication of memory devices of relatively high density while providing the lowest cost per bit of any memory device currently available.

Memory devices, such as DRAM, are most commonly identified according their data storage handling capability, generally referred to as the capacity of the device. For example, a 128 megabit DRAM device contains approximately 134 million memory cells, each capable of storing a discrete logic state, or bit, in an array having a predetermined number of rows and columns. In practical devices, information is stored in address locations that include more than a single bit, so that the 128 Mb DRAM may be configured, for example, as a 32 Mb device having 4 bits per address, which is commonly referred to as a 32 Mb×4 device. Alternatively, other configurations are possible, since the 128 Mb DRAM may also be configured with 8 or 16 bits per address to form a 16 Mb×8 or an 8 Mb×16 devices, respectively. Other configurations are also well known, and include DRAM devices having memory arrays arranged in banks of predetermined size.

In order to specify an address location for the reading or writing of data to the DRAM, address lines are provided so that the device may accept address inputs. The number of address lines required depends in general on the particular configuration selected for the device. Referring once again to the exemplary 128 megabit DRAM device, if the device is configured as a 32 Mb×4 device, 25 address lines are required. Correspondingly, if the device is configured as a 16 Mb ×8, or a 8 Mb×16 device, the required number of address lines are 24 and 23, respectively. Thus, the number of address lines changes as the memory configuration changes. In addition, the number of data input/output lines to the device also depends on the selected configuration. For example, for the ×16 configuration, sixteen data input/output lines are required, while the ×8 configuration requires only eight. Still fewer are required for the ×4 configuration.

During the DRAM manufacturing process, address lines and data input/output lines are formed on the die to support all of the desired memory configurations. The device is then configured to correspond to a single memory device by various methods. Most commonly, fuses are formed in the die that may be selectively opened to form the desired address lines and data input/output lines. Alternatively, anti-fuses may be formed in the die that form the desired address lines and data input/output lines when a suitable programming voltage is applied. In either case, the device generally may not be further reconfigured into any other of the possible single memory devices, since the configuration process is irreversible. Consequently, address lines and data input/output lines are often formed on the die that cannot be used in the configured device.

A particular disadvantage associated with the foregoing configuration procedure is encountered during the testing of the device. Typically, a die is subjected to a number of production test procedures in order to verify that the die is fully operational. During one portion of the test procedure, a predetermined test pattern is written to a selected address, and then subsequently read from the same address. If the address location fails to produce the same pattern that was initially written, an error is noted. If the same pattern is detected, the address location is verified as functional, and the test is continued until a defective memory address is detected, or alternatively, the test is completed without detecting any defective addresses. When testing is performed on the die, the testing generally proceeds according to a "wide" test format, wherein the size of each address is large. For example, the 128 megabit DRAM device described earlier may have addresses as large as 16 bits, or 32 bits or even larger addresses during wide testing. Following the completion of the testing, the die is configured into a particular memory device, and is packaged, which generally includes forming connections between various portions of the die and conductors on the package.

Following the packaging procedure, the device is subjected to additional tests that also generally include testing the address locations in the die in the manner described above. Since the device has been configured, however, the ability to test memory addresses by a wide test procedure is no longer possible, since the device has been configured to include addresses of smaller size. Accordingly, a "narrow" test format must be used in post-packaging testing of address locations. Since narrow test procedure must test more address locations that the wide test procedure, more time is required to complete the post-packaging testing using the narrow test.

A packaged memory device may also include more than a single die having suitable interconnections between the individual die that permits the interconnected die to cooperatively form a packaged memory device having a memory capacity that approximates the sum of the memory capacity of the individual die. An example of a multiple die memory device is disclosed in U.S. patent application Ser. No. 10/355,781, filed Jan. 29, 2003 and entitled MULTIPLE CONFIGURATION MULTIPLE CHIP MEMORY DEVICE AND METHOD, which is commonly assigned and is incorporated by reference herein.

A disadvantage present in the foregoing multiple die memory device is that the post-packaging test procedure may reveal that one or more of the individual die has failed. Since the die have been interconnected, packaged and marked, the entire packaged device is generally discarded, even though other die within the package has been verified to be fully operational.

It is therefore desirable to have an apparatus and a method that permits a memory device to be selectively reconfigured, thus permitting the memory device to be tested according to a wide format test procedure after the memory die has been packaged. Further, and with specific reference to multiple die memory devices, it would be desirable to have a multiple die memory device that permits selective reconfiguration so that the operational die within the packaged device may be used.

SUMMARY OF THE INVENTION

The present invention is generally directed to a semiconductor memory apparatus having a selectable memory capacity and to methods for testing such devices. In one aspect of the invention, a computer system includes an input, output, and data storage devices, a processor coupled to the input, output and the data storage devices that includes an address bus, a control bus and a data bus to communicate address, control and data signals, a memory device coupled to the processor that includes address, data and command busses, and a configuration circuit interposed between at least one of the address, control and data buses of the processor and the respective address, control and data buses of the memory device to selectively couple lines in the address, control and data busses of the processor to lines in the address, control and data busses of the memory device.

In another aspect, a memory device includes a memory cell array having a plurality of individually addressable memory locations, the memory cell array being coupleable to one or more signal busses of an external device; and a configuration circuit interposed between the memory cell array and the signal busses of the external device to selectively couple portions of the one or more busses to the memory cell array. In a particular aspect, the configuration circuit includes one or more bi-stable relay devices, such as Micro-Electrical-Mechanical System (MEMS) relays.

In still another aspect of the present invention, a selectively configurable memory device includes a first memory die having a first memory capacity, a second memory die having a second memory capacity, and a configuration circuit operable to couple either or both of the first memory die and the second memory die to external circuits to selectively obtain a memory device having a third memory capacity.

In yet still another aspect, a method of testing a memory device having a memory cell array includes subjecting the memory cell array to a first test procedure to determine the operability of the array, the array having a first configuration, packaging the memory device in a device package, subjecting the packaged device to a second test procedure, and configuring the memory cell array to have a second configuration different from the first configuration.

DETAILED DESCRIPTION OF THE INVENTION

The present invention is generally directed to semiconductor memory devices, and in particular to semiconductor memory devices that may be selectively reconfigured by Micro-Electrical-Mechanical Systems (MEMS) devices. In the present context, MEMS refers generally to the integration of mechanical elements and microelectronic devices on a common silicon substrate using currently available or hereinafter developed micro-fabrication technology, such as photolithography, chemical etching processes and the like. Many of the specific details of certain embodiments of the invention are set forth in the following description and in FIGS. 1-4 to provide a thorough understanding of such embodiments. One skilled in the art will understand, however, that the present invention may be practiced without several of the details described in the following description. Moreover, in the description that follows, it is understood that the figures related to the various embodiments are not to be interpreted as conveying any specific or relative physical dimension. Instead, it is understood that specific or relative dimensions related to the embodiments, if stated, are not to be considered limiting unless the claims expressly state otherwise.

Figure 1:
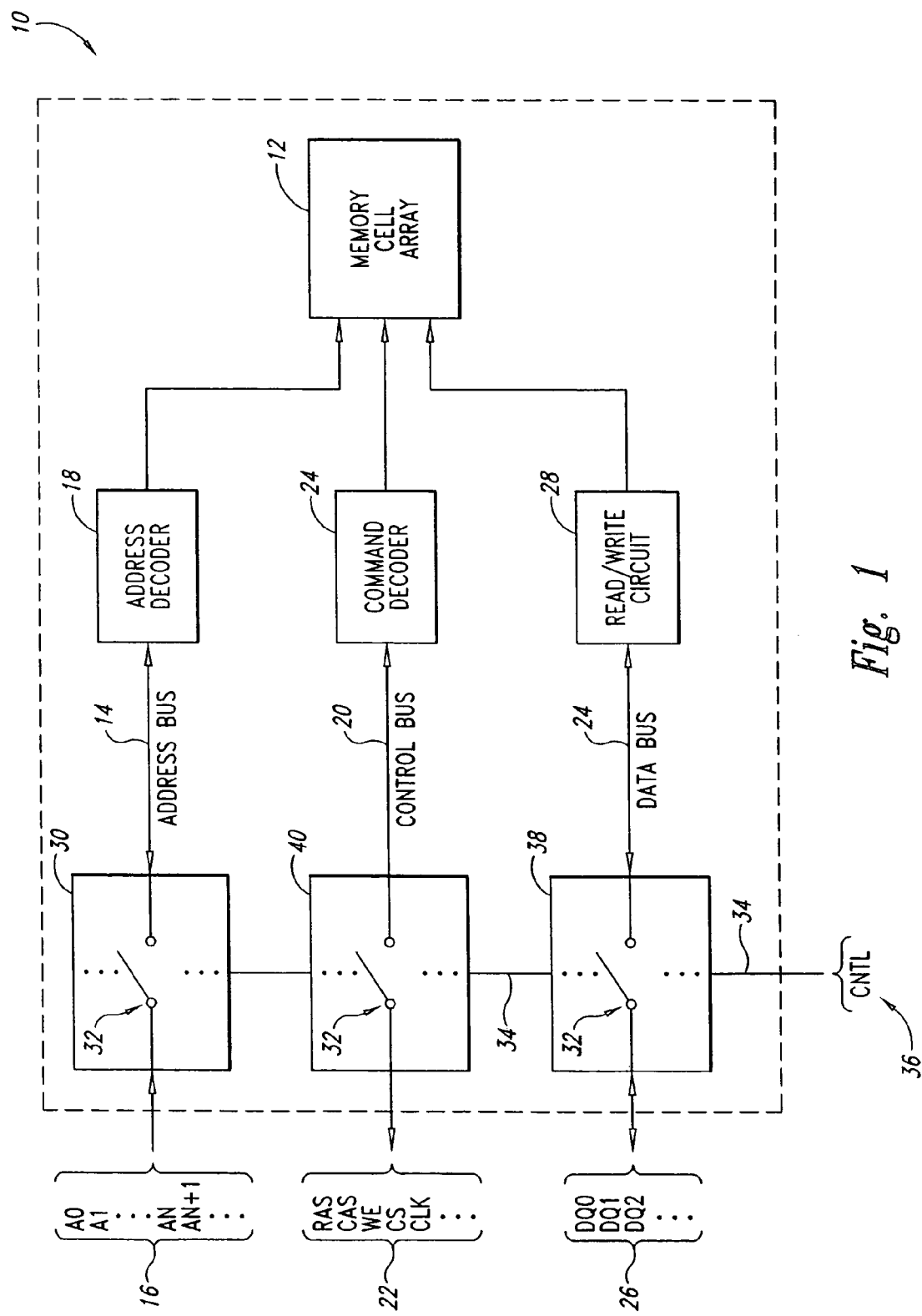
FIG. 1 is a block view of a memory device according to an embodiment of the invention.

FIG. 1 is a block view of a memory device 10 according to an embodiment of the invention. The memory device 10 includes a memory cell array 12 that includes a predetermined number of memory cells that are interconnected by row and column lines (not shown). The memory cells are configured to store a logic 0 or a logic 1, and to communicate the logic state along the column lines when a row of memory cells in the array 12 is suitably addressed. The memory cells within the array 12 may therefore include any of a variety of devices capable of storing a logic state, such as the well-known capacitor and transistor combination in a DRAM device. Alternatively, the memory cells may include other bi-polar devices, such as a flip-flop circuit, as used in a static random access memory (SRAM). In either case, the memory cell array 12 may also be configured so that the memory cells of the array 12 are arranged in separate banks of memory cells as is well known in the art.

The memory device 10 also includes an address bus 14 that is coupled to external circuits (not shown) to transfer address signals 16 from the external circuits to the memory device 10. The address signals 16 permit a desired memory location within the memory array 12 to be specified for read and/or write operations. The address bus 14 is also coupled to an address decoder 18 to decode the address signals 16 that are transferred along the address bus 14 so that a decoded memory address may be provided to the array 12. A control bus 20 is similarly coupled to external circuits, and is configured to transfer control signals 22 to the memory device 10 to control various operational aspects of the device 10. The control signals 22 may include, for example, row address strobe (RAS) and column address strobe (CAS) signals to strobe row and column addresses, respectively, and a write enable (WE) signal that enables data to be written to the array 12. Still other control signals may be present to control still other operational aspects of the device 10. For example, a chip select (CS) signal may be used to select a particular memory device for access when more that a single memory device is coupled to the address, control and data signals generated by the external circuits. A clock signal (CLK) may also be present to control the timing of operations within the device. 10. The control bus 20 is coupled to a command decoder 24 to decode the command signals 22 that are transferred to the array 12. Finally, a data bus 24 is also coupled to external circuits to transfer data signals 26 from the device 10 to the external circuits, or correspondingly, to transfer the data signals 24 from the external circuits to the device 10. A read/write circuit 28 is also coupled to the bus 24 to transfer the data signals 26 to the array 12.

Still referring to FIG. 1, the memory device 10 includes an address configuration circuit 30 coupled to the address bus 14. The address configuration circuit 30 includes at least one bi-stable relay 32 that is coupled to a selected single address line in the bus 14. The bi-stable relay 32 may be comprised of a MEMS bi-stable relay that has a closed state that permits signals transferred along the selected address line to be communicated from the external circuits to the address decoder 18, and an open state, that interrupts the communication of signals communicated along the selected line. The MEMS bi-stable relay is capable of being configured in either the closed state or the open state when the MEMS bi-stable relay is energized by a suitable source, and is further capable of retaining (or latching) the selected state when the source is decoupled from the MEMS bi-stable relay. Accordingly, the address configuration circuit 30 is coupled to a configuration control line 34 that receives a configuration control signal 36 from an external circuit to position the bi-stable relay 32 into either a closed state or an open state, as desired. In a particular embodiment, the bi-stable relay 32 is a MEMS bi-stable relay that is electrostatically actuated by applying a voltage to the configuration control line 34 of approximately about 0.5 volts to approximately about 150 volts. Suitable MEMS bi-stable relay devices are described in detail by Gomm, et al.; *In Plane Linear Displacement Bistable Relay*; J. Micromech. Microeng. 12 (2002) at 1-8, and J. Kim, et al.; *Mercury Contact Micromechanical Relays*; Proc. 46$^{th}$ Annual Int. Relay Conf.; pp. 19-1 to 19-8 (April 1998), which are herein incorporated by reference.

The memory device 10 also includes a data configuration circuit 38 that is coupled to the data bus 24. The circuit 38 similarly includes at least one bi-stable relay 32 that is coupled to a selected single data line in the bus 24. The data configuration circuit 38 is also coupled to the configuration control line 34 so that the configuration control signal 36 may position the bi-stable relay 32 into either a closed state or an open state, which in general, corresponds to selection of address lines in the circuit 30. For example, if a single additional address line is selected by closing a specified bi-stable relay 32 in the circuit 30, the corresponding number of data lines in the circuit 38 will be halved, so that bi-stable relays 32 in the circuit 38 will accordingly be opened.

The memory device 10 may also include a control configuration circuit 40 that is coupled to the control bus 20. The circuit 40 also includes at least one bi-stable relay 32 to couple a selected portion of the control signals 22 to the device 10. For example, if the memory device 10 is a synchronous DRAM (SDRAM), a CLK signal will be required to properly synchronize operations within the device 10. In other memory devices, however, the CLK signal may not be required.

In operation, the device 10 may read data stored in the array 12, and provide the data to the external circuits in the following manner. Address signals 16 corresponding to a desired address are provided to the address bus 14. Control signals 22 are also provided to the control bus 20, to control the read operation. The address decoder 18 provides a decoded address to the array 12, while the command decoder 24 decodes the control signals on the control bus 20 and transfers the decoded control signals to the array 12. The decoded signals control the array 12 so that the array 12 provides data to the read/write circuit 28. The read/write circuit 28 then provides this data to the data bus 24, which may then be transferred to the external circuits. When data is written to the device 10, address signals and control signals are again supplied to the address bus 14 and the control bus 20 by the external circuits. In addition, data signals 26 are provided to the data bus 24 by the external circuits. Once again, the address decoder 18 decodes the address on the address bus 14 and provides the decoded address to the array 12. The read/write circuit 28 then transfers the data from the data bus 24 to the array 12 under the control of the decoded control signals received from the command decoder 24.

Although the data configuration circuit 38, the address configuration circuit 30 and the control configuration circuit 40 are shown in FIG. 1 as separate units within the memory device 10, it is understood that the foregoing may be incorporated into a single functional unit that selectively couples and decouples address, data and control lines between the external circuits and the device 10 when a configuration control signal 36 is applied. It is also understood that the application of the configuration control signal 36 may latch selected bi-stable relay 32 in a closed state, while simultaneously latching other bi-stable relay 32 in an open state. It is further understood that the configuration control signal 36 may be directed to bi-stable relay 32 that are coupled solely to address and data input lines. Alternatively, the configuration control signal 36 may be directed to bi-stable relays 32 that are coupled solely to address and data input lines. Finally, it is understood that more than a single configuration control signal 36 may be applied to the device 10 on separate lines 34 to individually control the data configuration circuit 38, the address configuration circuit 30 and the control configuration circuit 40 within the memory device 10.

The foregoing embodiment permits address and data lines to be selectively coupled and decoupled to the memory device 10 using one or more bi-stable relays 32. The bi-stable relay 32 advantageously maintain a selected state once actuated, and do not require a connection to a constant energy source in order to maintain the selected state. Accordingly, the foregoing embodiment has significant advantages over other prior art devices. For example, since the selected state of the bi-stable relay is maintained independently of a connection to any energy source, the state is not lost when power is interrupted to the memory device. Furthermore, the selected state of the bi-stable relays 32 is reversible, through the application of a suitable configuration signal to either the address configuration circuit and/or the data configuration circuit. In contrast, various prior art devices, such as fuses and antifuses irreversibly alter the configuration of the memory device 10. This desirable characteristic has various advantages, as will be explained in greater detail in connection with the other embodiments. In particular, the ability to change the configuration of a memory device at various times during manufacturing test procedures, is particularly advantageous, as will be discussed in detail below.

Figure 2:
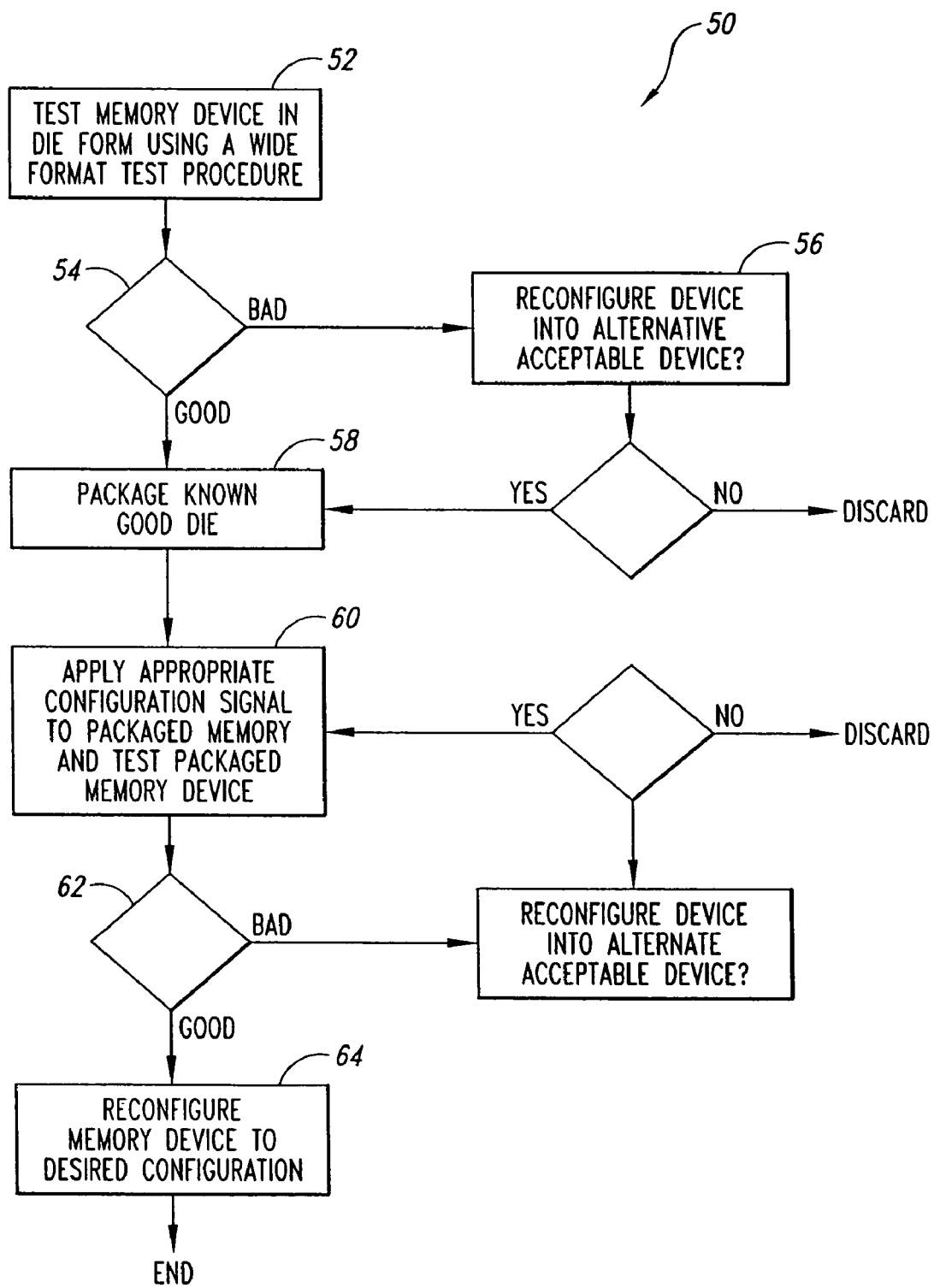
FIG. 2 is a flow diagram that illustrates a method for testing a memory device according to another embodiment of the invention.

FIG. 2 is a flow diagram that illustrates a method 50 for testing the memory device of FIG. 1 according to another embodiment of the invention. The memory array 12 of the memory device 10, as shown in FIG. 1, is typically subjected to a production test procedure to determine if any of the cells that comprise the array 12 are defective. Typically, a test pattern consisting of a pre-selected combination of 1's and 0's is written to an address within the array 12 and subsequently read from the address and compared to the applied test pattern to determine if any defective cells exist in the address. In general, a memory device is subjected to the foregoing test procedure when in die form, so that a wide format test pattern may be used. In a wide format test, the address width for the device 10 is maintained as large as possible to permit a relatively large number of memory cells in the array 12 to be tested simultaneously, as shown in step 52. If the cells comprising the array 12 do not test good, or if other defects in the device 10 are detected, the die is either rejected or accepted, as shown in step 54. At this point, a determination regarding alternative configurations for the die may be made, as shown in step 56. For example, if the die has failed the foregoing memory cell pattern test, and other remedies such as selecting a redundant row in the memory device 10 to replace a defective row, as is known in the art, fails to correct the defect, the memory capacity of the device may be degraded by selectively decoupling the defective portion of the array from the device. As a result, the defective memory die may be configured and packaged as a device having a lower memory capacity, which may be adequate for other alternative applications.

If the die tests good at step 54, or it is determined that the die may be configured into an acceptable and marketable form, the die may proceed to a packaging step 58. During this step, the die is positioned within a suitable package, such as a small thin outline package (TSOP), or another suitable package, and appropriate interconnections between bond pads on the die and pins on the package are formed. The packaged device may then proceed to a second test procedure at step 60 that again tests the array 12 for defective cells by applying a test pattern to various addresses within the memory array 12. Ordinarily, during the packaging procedure, a device will be configured into its final form (e.g. by opening fuses formed on the die, or by programming anti-fuses on the die, or by the manner in which bond wires are attached to the die) prior to the implementation of the second test procedure, so that the packaged device must be tested according to the device configuration adopted during the packaging step. As described previously, however, the bi-stable relays 32 of the memory device 10 (as shown in FIG. 1) may be selectively opened or closed by applying a suitable configuration control signal to the packaged device. The packaged device may therefore be advantageously tested according to the wide format procedure employed at step 52, thus reducing the time required to test the array 12 in the memory device 10.

Still referring to FIG. 2, if defects are detected in the packaged device at step 60, another assessment may be made to determine whether the packaged device is configurable into a marketable form. For example, the memory capacity may be further curtailed for the device, whereupon it may be segregated and suitably identified as qualified for applications requiring not more than the memory capacity that successfully tested at step 60. If the packaged device successfully passes the tests conducted at step 60, it is then reconfigured into the desired device at step 64 by again applying an appropriate configuration control signal to the packaged device.

The foregoing procedure advantageously allows a memory device to be configured during a production test procedure so that the array within the device may be tested in an optimal manner. In particular, the ability to subject a packaged device to a wide format test procedure is viewed as particularly advantageous, since the time required to fully test an array is greatly reduced. Still other advantages are present. For example, devices that cannot successfully pass the test procedures at steps 52 and 60 may be adapted to conform to other product applications by configuring the device so that it utilizes the memory capacity demonstrated to be good.

Figure 3:
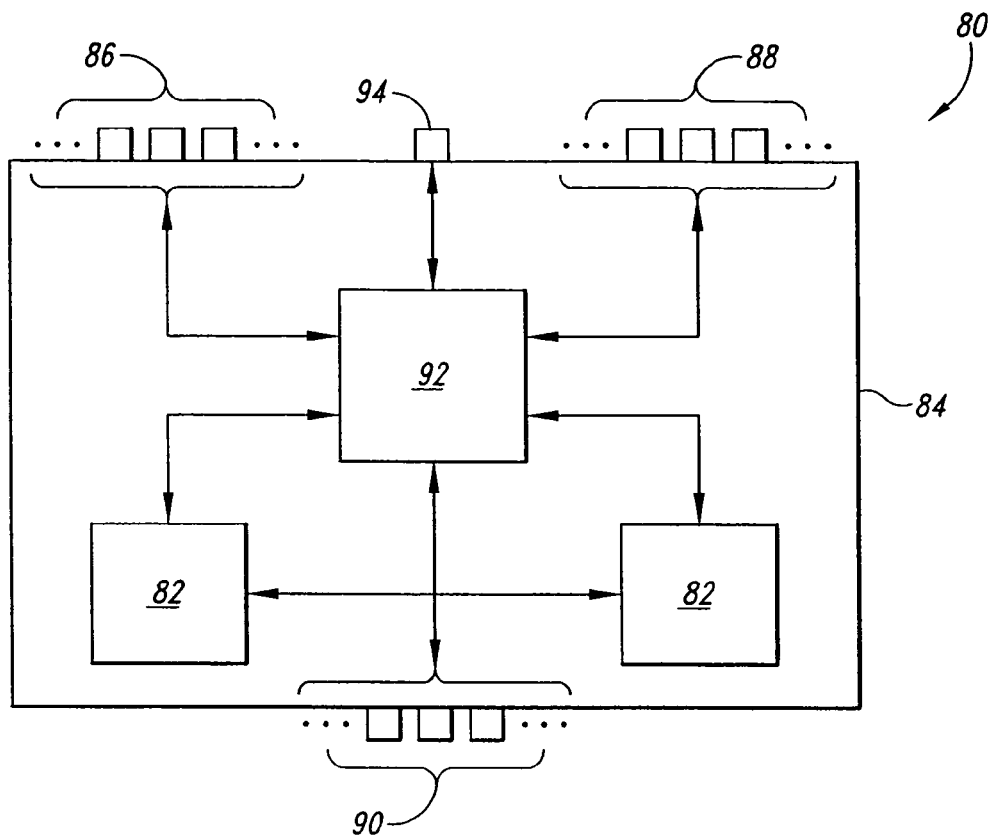
FIG. 3 is a block diagram of a memory device according to yet another embodiment of the invention.

FIG. 3 is a block diagram of a memory device 80 according to yet another embodiment of the invention. The memory device 80 includes a pair of memory dies 82 positioned within a package 84. The memory dies 82 are interconnected within the package 84 to cooperatively form a memory device having a memory capacity that is approximately about the sum of the memory capacities of the dies 82. For example, if the dies 82 are 128 Mb DRAM dies, the memory capacity of the device 80 is then approximately about 256 Mb. The memory device 80 also includes a plurality of address pins 86 positioned on the package 84 to transfer address signals to the device 80. Similarly, a plurality of data input/output pins 88, and a plurality of control pins 90 are positioned on the package 84 to permit data to be transferred to and from the device 80, and to permit the device 80 to be controlled by external circuits coupled to the device 80. Although a pair of memory dies 82 are shown in FIG. 3, it is understood that more than two memory dies may be positioned within the package 84.

Still referring to FIG. 3, the device 80 includes a configuration circuit 92 that couples the address pins 86, the data input/output pins 88 and the control pins 90 to the memory dies 82. The configuration circuit 92 includes a plurality of bi-stable relays (not shown in FIG. 3) that may be selectively opened or closed by transferring a suitable signal from the external circuits to the configuration circuit 92 through one or more configuration pins 94 that are positioned on the package 84. In a particular embodiment, the bi-stable relays may include bi-stable MEMS devices or any other device that performs a similar function, as described in connection with other embodiments. Although the configuration circuit 92 is shown as a separate unit within the package 84 that is spaced apart from the memory die 82, one skilled in the art will readily understand that that the configuration circuit 92 may also be incorporated within the memory die 82.

The foregoing embodiment advantageously allows a packaged device to be salvaged if one of the memory die within the packaged device is rejected during testing. For example, if the packaged device is a 256 Mb device comprised of a pair of 128 Mb die, when one of the die fails to test good, the packaged device may be configured as a 128 Mb device only, and suitably marked as such. The foregoing embodiment has still other advantages. For example, it is well known that costs associated with inventory control are increased as the number of distinct items maintained in the inventory increases. Because the foregoing embodiment allows flexibility in the size of the memory, generally fewer packaged devices would need to be maintained in an inventory, since an ultimate consumer would be able to configure the device according to the consumer's requirement. Further, the flexibility in the memory size in the foregoing embodiment allows a manufacturer to rapidly reconfigure memory devices in order to meet a sudden or unexpected demand for memory devices having a particular configuration. For example, devices having the same structure may be maintained in inventory and selectively configured to fill orders for a 128 Mb×4 memory device, a 64 Mb×8 memory device, a 32 Mb×16 memory device, etc.

Figure 4:
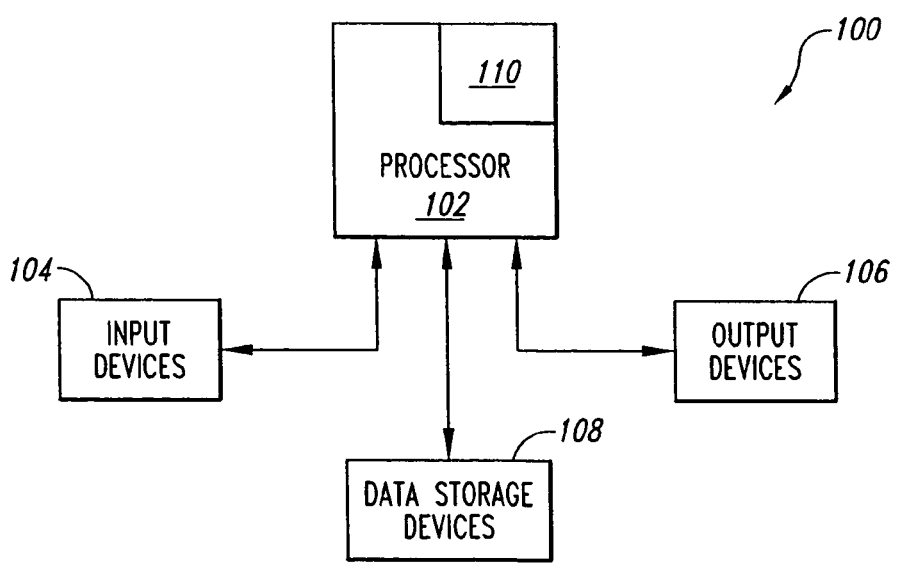
FIG. 4 is a block diagram of a computer system according to still another embodiment of the invention.

FIG. 4 is a block diagram of a computer system 100 according to still another embodiment of the invention. The computer system 100 includes a memory device 110 that is configured using the bi-stable relay devices as disclosed in connection with the various embodiments of the present invention. The computer system 100 includes a processor 102 that performs various computational functions, such as executing specific software to perform specific calculations. The processor 102 may also perform various control operations associated with the operation of the system 100. The computer system 100 may also include one or more input devices 104, such as a keyboard or a mouse, which are coupled to the processor 102 to allow an operator of the system 100 to communicate with the system 100. In general, the computer system 100 also includes one or more output devices 106 that are also coupled to the processor 102. The output devices 106 may include a printer, or a visual display device. One or more data storage devices 108 are also typically coupled to the processor 102 to store data, or to retrieve other data from an external data storage device. For example, the data storage device 108 may include hard and/or floppy disks, tape cassettes, and compact disk read only memories (CD-ROMs). The processor 102 is typically coupled to the memory device 110 through a control bus, a data bus, and an address bus to permit data to be written and/or read from the device 110.

From the foregoing it will be appreciated that, although specific embodiments of the invention have been described herein for purposes of illustration, various modifications may be made without deviating from the spirit and scope of the invention. For example, certain features shown in the context of one embodiment of the invention may be incorporated into other embodiments as well. Accordingly, the invention is not limited by the foregoing description of embodiments except as by the following claims.

The invention claimed is:

1. A method of testing a memory device having a memory cell array, comprising:
    subjecting the memory device to a first test procedure to determine the operability of the memory cell array of the memory device, the memory device having a first configuration and a first capacity;
    packaging the memory device in a device package;
    if the memory cell array is partially operable, configuring the memory device to have a second configuration different from the first configuration such that the memory device is reconfigured to have a second memory capacity that is less than the first memory capacity; and
    after configuring the memory device to the second configuration, subjecting the packaged device to a second test procedure to verify the operability of the memory device.

2. The method of claim 1, wherein the first and second test procedures test the memory cell array of the memory device.

3. The method of claim 1, wherein the first and second test procedures are wide test procedures.

4. A method of testing a memory device having a memory cell array, comprising:
    subjecting the memory device to a first test procedure to determine the operability of the device, the memory device having a first configuration;
    packaging the memory device in a device package and connecting the memory device to a plurality of pins coupled to a package;
    configuring the memory device to have a second configuration different from the first configuration; and
    after configuring the memory device to the second configuration, subjecting the packaged device to a second test procedure to verify the operability of the memory device, wherein the memory device includes a configuration circuit coupled to the memory array, and configuring the memory device further comprises applying a configuration signal to the configuration circuit to convert the memory device from the first memory configuration to the second memory configuration.

5. The method of claim 4, wherein applying a configuration signal to the configuration circuit further comprises determining a state in at least one bi-stable relay device within the configuration circuit.

6. The method of claim 4, wherein applying a configuration signal to the configuration circuit further comprises altering the position in at least one Micro-Electrical-Mechanical System (MEMS) relay within the configuration circuit.

7. The method of claim 1, further comprising establishing a desired memory configuration subsequent to the second test procedure.

8. A method of testing a packaged memory device, comprising:
    packaging a plurality of memory devices in a device package;
    configuring the memory devices to have a first configuration, the first configuration being maintained after power is removed from the package device;
    testing the packaged memory device; and
    configuring at least one memory device to have a second configuration, the second configuration being maintained after power is removed from the package device.

9. The method of claim 8 wherein testing the packaged memory device comprises testing at least one memory cell of at least one of the memory devices in the device package.

10. The method of claim 8 wherein reconfiguring the device package comprises applying a configuration signal to a configuration circuit within at least one memory device.

11. The method of claim 8 further comprising reconfiguring at least one memory device to a third configuration.

12. A method of testing memory devices, comprising:
    testing a plurality of memory devices using a first test;
    packaging the plurality of memory devices in a packaged memory device having a first configuration, the first configuration being maintained after power is removed from the packaged device;
    testing the packaged memory device using a second test; and
    configuring at least one memory device in the packaged memory device to a second configuration, the second configuration being different from the first configuration.

13. The method of claim 12 wherein the first and second tests comprise a wide format test procedure.

14. The method of claim 12 testing the packaged memory device comprises testing at least one memory cell of at least one memory device in the device package.

15. The method of claim 12 wherein the second configuration has a lower memory capacity than the first configuration.

16. A method of configuring a memory device package, comprising:
    packaging a plurality of memory devices in a memory device package;
    testing the memory device package;
    configuring the plurality of memory devices to have a first configuration, the first configuration being maintained after power is removed from the memory device package; and
    configuring at least one memory device to have a second configuration, the second configuration being maintained after power is removed from the memory device package, and the second configuration being different from the first configuration.

17. The method of claim 16 wherein configuring at least one memory device comprises applying a configuration signal to a configuration circuit within the memory device.

18. The method of claim 17 wherein applying a configuration signal to a configuration circuit further comprises determine a state in at least one bi-stable relay device within the configuration circuit.

19. The method of claim 17 wherein applying a configuration signal to a configuration circuit further comprises altering a position in at least one Micro- Electrical-Mechanical Systems (MEMS) relay within the configuration circuit.

20. A method of testing and packaging memory devices, comprising:
    testing a plurality of memory devices at a first configuration, the first configuration being maintained after power is removed from the memory device;
    based on the test results, reconfiguring the memory device to a second configuration, the second configuration being maintained after power is removed from the memory device, the second configuration being different from the first configuration; and packing the plurality of memory devices into a memory device package.

21. The method of claim 20 further comprising testing the memory devices in the memory device package by testing at least one memory array in each memory device.

22. The method of claim 21 further comprising configuring the memory devices to a third configuration based on the results from testing the memory devices in the memory device package.

23. The method of claim 22 wherein the third configuration has a lower memory capacity than the first configuration.

* * * * *